(12) United States Patent
Burry

(10) Patent No.: US 6,618,147 B1
(45) Date of Patent: Sep. 9, 2003

(54) ALIGNING DEVICE FOR ASSEMBLING MICROSYSTEMS

(75) Inventor: Jean-Michel Burry, Lalleyriat (FR)

(73) Assignee: Optiques et Microsystems SA, Montreal la Cluse (FR)

( * ) Notice: Subject to any disclaimer, the term of this patent is extended or adjusted under 35 U.S.C. 154(b) by 0 days.

(21) Appl. No.: 09/890,304

(22) PCT Filed: Jan. 28, 2000

(86) PCT No.: PCT/FR00/00212

§ 371 (c)(1),
(2), (4) Date: Dec. 3, 2001

(87) PCT Pub. No.: WO00/46642

PCT Pub. Date: Aug. 10, 2000

(30) Foreign Application Priority Data

Feb. 3, 1999 (FR) .............................. 99 01415

(51) Int. Cl.$^7$ .................. G01B 11/00; G01B 11/26; G01B 27/44; G01B 27/14; G01N 21/00
(52) U.S. Cl. ............... 356/400; 356/399; 356/401; 356/138; 356/153; 356/508; 356/237.1; 359/565; 359/839
(58) Field of Search ................. 356/399, 400, 356/401, 138, 153, 508, 237.1, 237.2, 237.3, 237.4, 237.5; 359/565, 839

(56) References Cited

U.S. PATENT DOCUMENTS

| | | | |
|---|---|---|---|
| 3,694,091 A | 9/1972 | de Lang | 356/172 |
| 4,398,824 A | 8/1983 | Feldman et al. | 356/401 |
| 4,521,114 A | 6/1985 | Van Peski et al. | 356/401 |
| 4,595,295 A * | 6/1986 | Wilczynski | |
| 5,867,319 A * | 2/1999 | Sugiyama et al. | |
| 5,896,226 A | 4/1999 | Peuchot et al. | 359/472 |

FOREIGN PATENT DOCUMENTS

FR  2720523  12/1995

* cited by examiner

*Primary Examiner*—Frank G. Font
*Assistant Examiner*—Khaled Brown
(74) *Attorney, Agent, or Firm*—Fay, Sharpe, Fagan, Minnich & McKee, LLP

(57) ABSTRACT

Microsystems or micro-biotechnical components (1) are aligned, assembled, and dispensed onto a substrate (2). An image of a microsystem receiving region of the substrate is focused along hollow cones onto an image plane (23). The microsystem (1) is positioned within the hollow cones such that the image passes around it unaffected. A semi-transparent plate (24) permits the substrate image to pass therethrough and reflects an image of a surface of the microsystem which is facing the substrate to be reflected and pass along the same hollow conical paths to the image plane. In this manner, the images of the substrate and the micro component are superimposed. A mechanical device (11) adjusts the position of the microsystem until the images of the facing surfaces of the microsystem and the substrate are brought into preselected alignment. This device is particularly adapted for assembling electro-mechanical or micro-optoelectric mechanical modules, accurate setting of droplets on a biological micro-component (microchip).

14 Claims, 11 Drawing Sheets

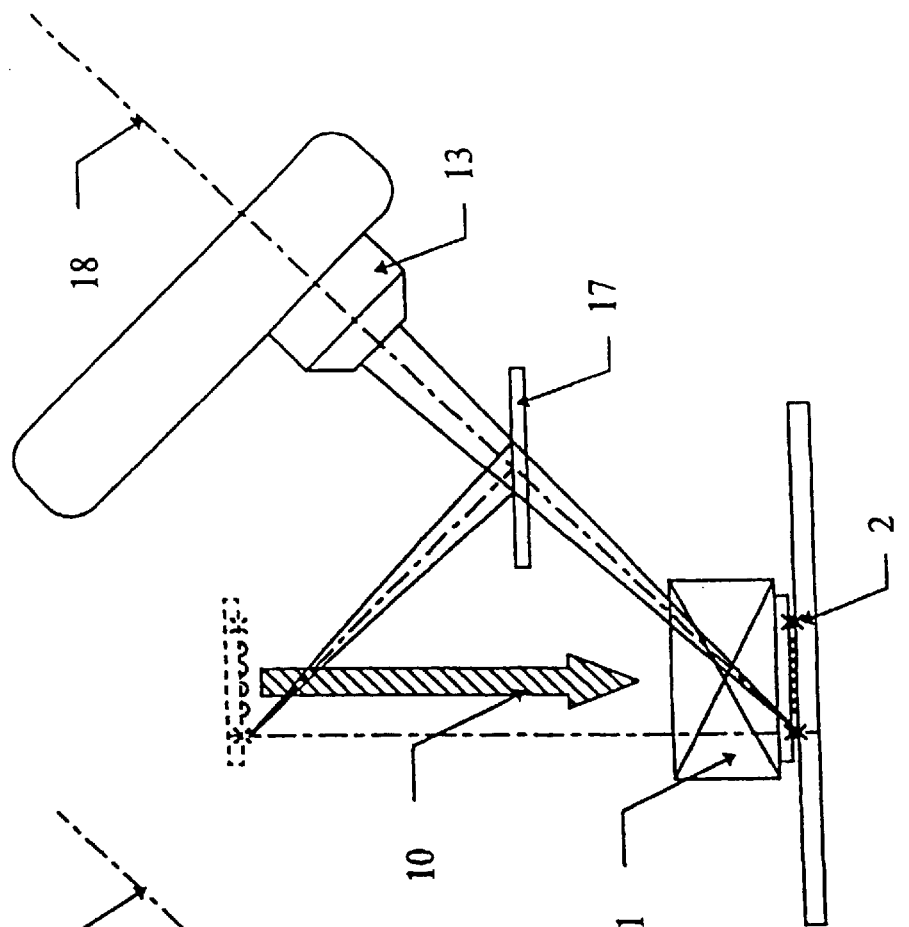
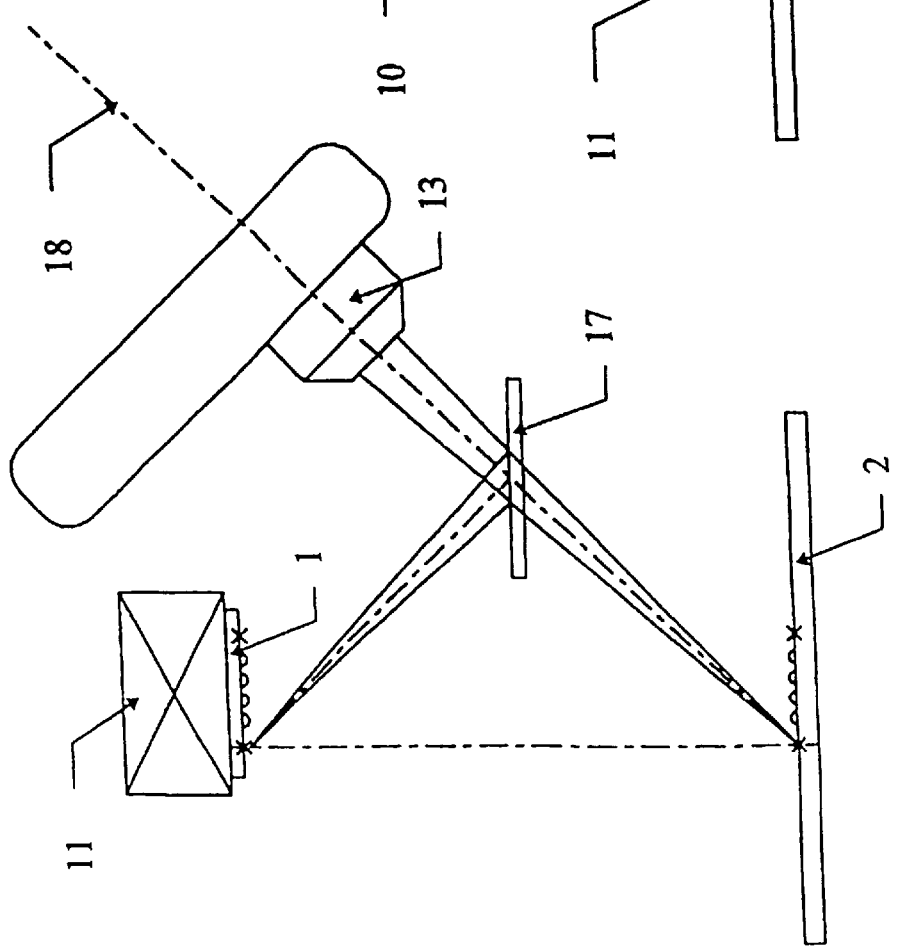
Figure 5a (PRIOR ART)
Figure 5b (PRIOR ART)

ALIGNING DEVICE FOR ASSEMBLING MICROSYSTEMS

TECHNICAL FIELD OF THE INVENTION

The present invention concerns a visualization device for alignment and positioning with respect to micro-mechanical and micro-optical devices, including micro-electronic (chips), and opto-electronic devices (laser diodes, photodiodes), or others by component reversal method (alignment of two opposite surfaces). The assembly process is schematically represented in FIGS. 1a and 1b.

With respect to FIG. 1a, the examined component transfer method consists of placing in accurate fashion, one or several components 1 on a substrate 2. In general, component 1 and the substrate 2 are not transparent. In order to assure precise placement, alignment marks 3 and 4 can respectively be traced on the lower surface of component 1 and the upper surface of the substrate 2. Final assembly of the device can be realized by means of gluing, welding or natural adhesion thanks to the possible presence of welding contacts 5 and 6 or glue, which are respectively present on component 1 and/or the substrate 2. Any other assembly method can also be envisioned. This final assembly constitutes a new hybrid component—FIG. 1b.

PRIOR STATE OF THE ART

When the assembly involves small components (size on the order from 0.2 mm to 5 mm) for which high precision in placement is required (on the order from 0.5 µm to several µm) a number of different methods are usually utilized.

FIG. 2a and FIG. 2b illustrate a method which consists of utilizing a dual sighting system comprising two microscope lenses 7 and 8, one sighting the lower surface of component 1, the other sighting the upper surface of substrate 2. These microscopes permit visualizing the alignment designs 3 and 4 and allow for correction of placement defects.

Following correction, a movement of retraction 9 is applied to the sighting system, since a displacement program is applied to the component 1 through the intermediary of a mechanical device 11 in order to place same on the substrate 2.

This method poses the following technical problems:
Utilization of two microscopic sighting systems requiring precisely the same characteristics (pairing).
Need to retract the microscopes before placement of component.
Significant placement distance of component, detrimental to large production output.

FIG. 3a and FIG. 3b illustrate a variation of the preceding method, utilizing two fixed microscopes 7 and 8 and applying two displacements 10 and 12 to the component This method poses the following technical problems:
Utilization of two microscopic sighting systems needing precisely the same characteristics (pairing).
Two significant placement distances of the component, detrimental to large production output.
Need for horizontal displacement 10 with absolute high precision.

FIG. 4a and FIG. 4b illustrate a method utilizing a single microscopic sighting system 13 and a beam separator cube 14 permitting superposing the images of the component 1 and the substrate 2 at time of alignment. Following alignment, a retraction movement 15 of the separator cube 14 is performed in order to position the component 1 on the substrate 2.

This method poses the following technical problems:
The final position of the component is sensitive to the thickness of the component (a very thin component will result in quite significant tilting and a very thick component will result in very weak tilting).
Need to retract the prism before placement of component.
Significant sighting distance, generally incompatible with utilization of high resolution and strong magnification microscopes.
Sighting through heavy glass, generally detrimental with the use of strong magnification microscopes.

FIG. 5a and FIG. 5b illustrate a method utilizing a single microscopic sighting system 13 and a semi-reflecting plate 17 permitting superposing the images of the component 1 and the substrate 2 at time of alignment. After alignment, a displacement program 10 is applied to the component 1 through the intermediary of a mechanical device 11 in order to place same on the substrate 2.

This method poses the following technical problems:
The final position of the component is sensitive to the thickness of the component, the system presenting a defect in parallax (absence of parallelism between the sighting axis 18 and the deposit axis 10).
Significant sighting distance, generally incompatible with high resolution and strong magnification microscopes.
Sighting of substrate 2 through a semi-reflecting glass plate 17 inclined in relation to the median sighting axis 18. Said configuration introduces optical aberrations such as coma and astigmatism, which reduces the resolution and enlargement capacities of the sighting system.

FIG. 6a and FIG. 6b illustrate a method which is applicable when the component 1 is transparent over the length of the light wave utilized by the microscopic sighting system 13. Sighting takes place through the transparent support 11 of the component 1. When in alignment phase, the component 1 and the substrate 2 are separated by sufficient distance (d) so that the alignment movements can take place without contacts 5 and 6 touching each other. Following alignment, a transfer program 10 is applied to the component 1 through the intermediary of a mechanical device 11 in order to place same on the substrate 2.

This method poses the following technical problems:
Component 1 must be transparent and its two surfaces must be perfectly polished in order to permit formation of images of the substrate 2 and the component 1.
The component generally being semi-conductive, it is then necessary to resort to infra-red sighting systems.
The required separation distance (d) at time of alignment prevents perfect adjustment of the sighting system, simultaneously, as to the component 1 and the substrate 2.
The metallizations which are present on the bottom surface of the component 1 act as a screen and do not permit the visualization of the totality of the surface of the substrate 2.
It is impossible to differently illuminate the component 1 and the substrate 2.

The present invention provides a new and improved method and apparatus that overcomes the above referenced problems and others.

SUMMARY OF THE INVENTION

In accordance with one aspect of the present invention, an aligning device for microsystems is provided. The device includes a sighting system, a semi-reflective plate and a mechanical device for positioning a component. The reflective plate has a normal that merges with an optical axis of the sighting system.

One advantage of the present invention resides in utilization of a single microscopic sighting system for alignment of two components.

Another advantage resides in forming an enlarged image exactly united with the lower surface of component 1.

Another advantage resides in the placement of component 1 on substrate 2 without having to displace the microscopic sighting system 22.

Another advantage resides in minimizing the distance between the component 1 and the substrate 2 at time of alignment phase of the two components.

Another advantage resides in utilizing sighting devices 22 with high numerical apertures, compatible with high resolutions and strong magnifications, resulting in providing assurance of great precision in placement of the component 1 in relation to the substrate 2.

Another advantage resides in visualization of the lower surface of the component 1 and of the upper surface of the substrate 2 without parallax effect.

Another advantage resides in alignment of non-transparent components.

Another advantage resides in utilization of a relative alignment principle which does not require absolute displacement precision 10 of the maintenance device 11 of the component 1 when the latter is placed on the substrate 2.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

The preferred embodiment principally comprises a microscopic sighting system with a central shutter unit 22, a flat semi-reflecting plate 24 placed between the sighting system and a mechanical device 11 for maintaining and manipulating the component 1. An optical system with a central shutter is characterized in that the light beams which emerge from the focus of an object constitute hollow cones, whereas in the case of a traditional optical system, these beams constitute solid cones.

Figure 1A:
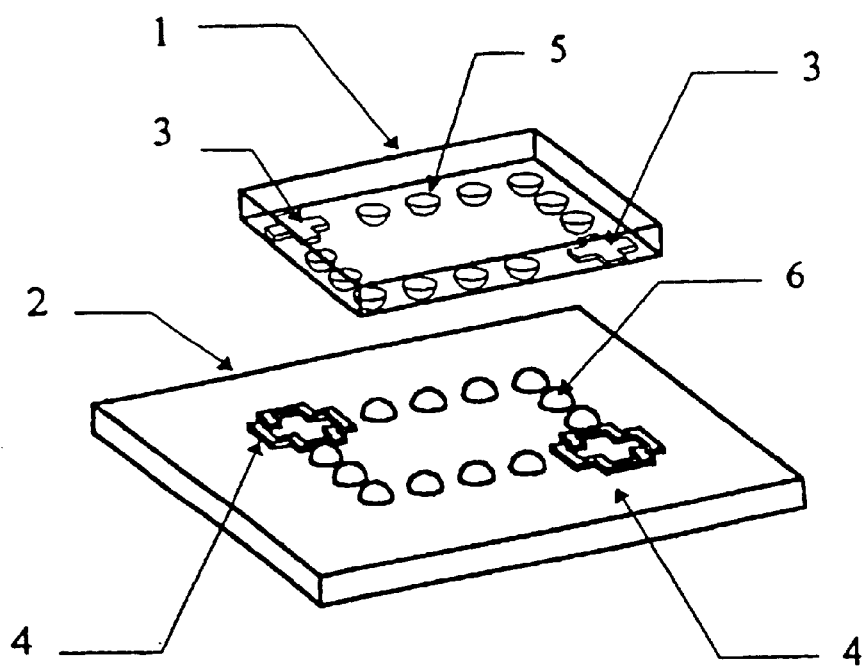
FIG. 1a and FIG. 1b illustrate the technical field of the invention, i.e., the process of component assembly by method of reversal of component.
Figure 1B:
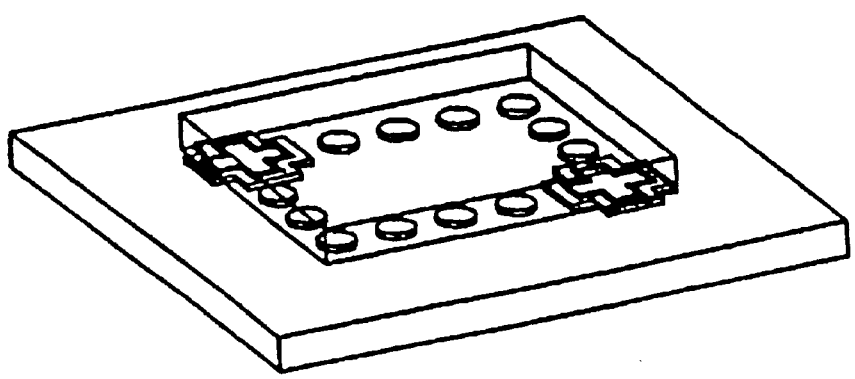
Figure 2B:
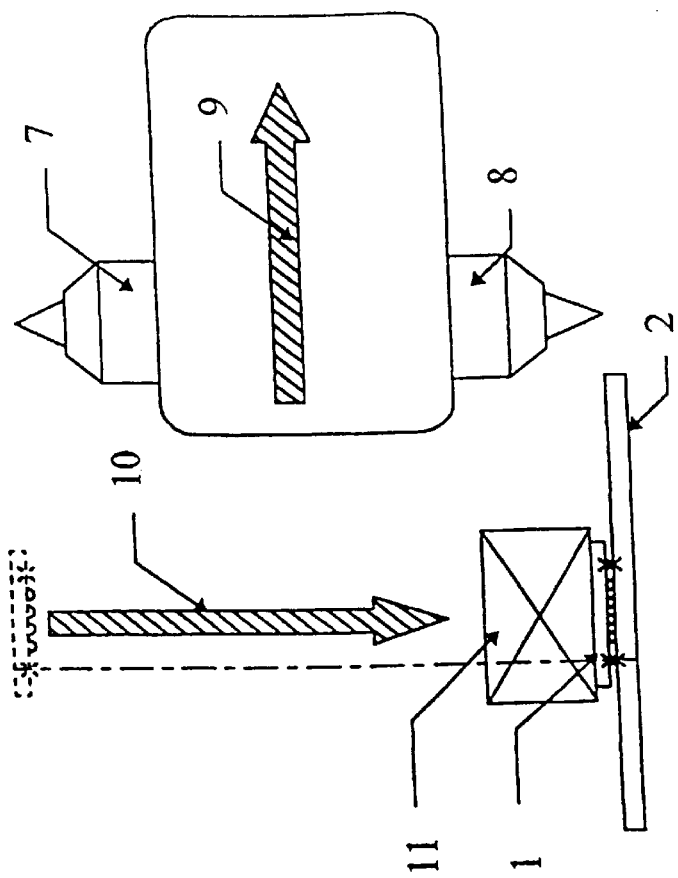
FIGS. 2a; 2b; 3a; 3b; 4a; 4b; 5a; 5b; 6a; 6b illustrate the prior state of the art relative to the invention.
Figure 2A:
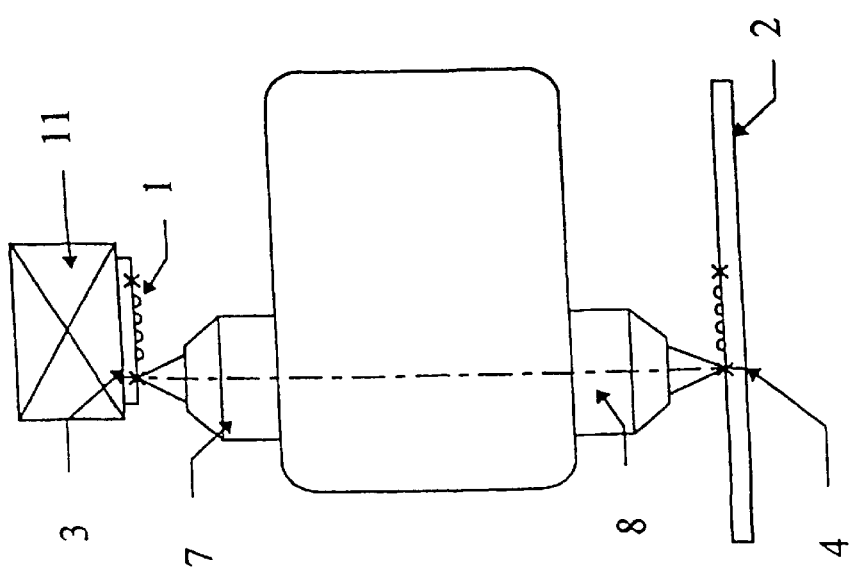
Figure 3B:
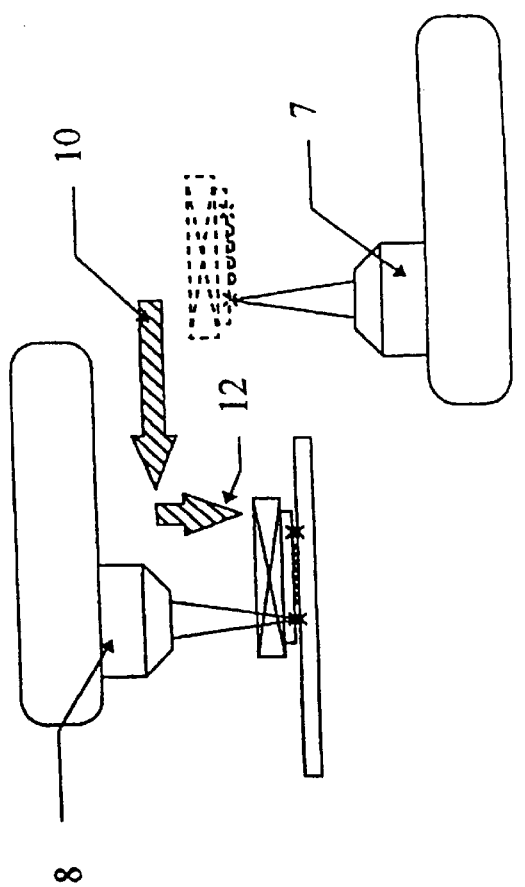
Figure 3A:
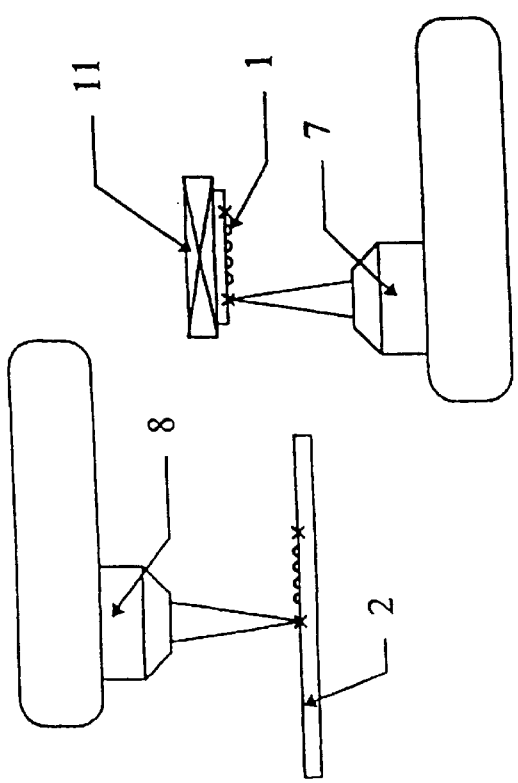
Figure 4B:
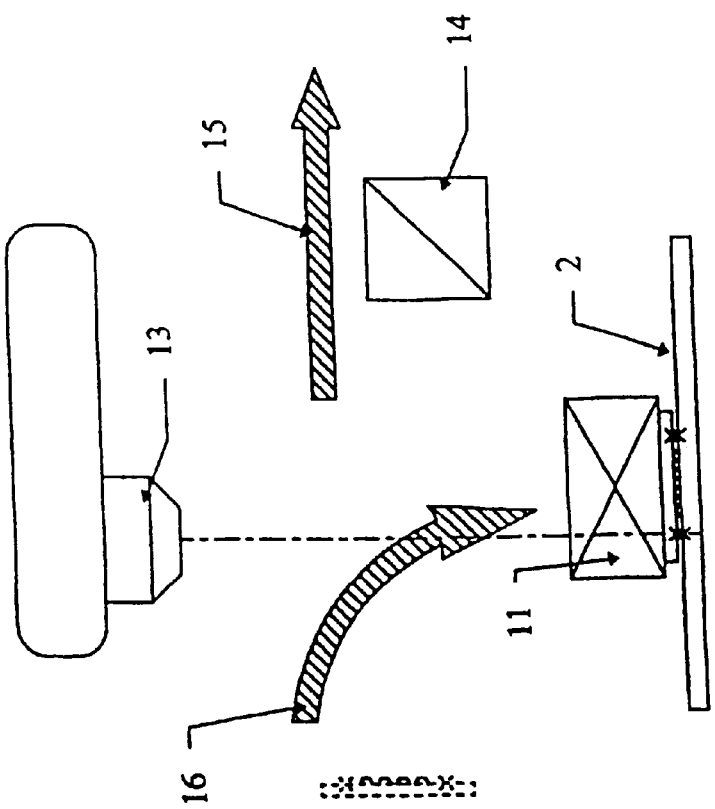
Figure 4A:
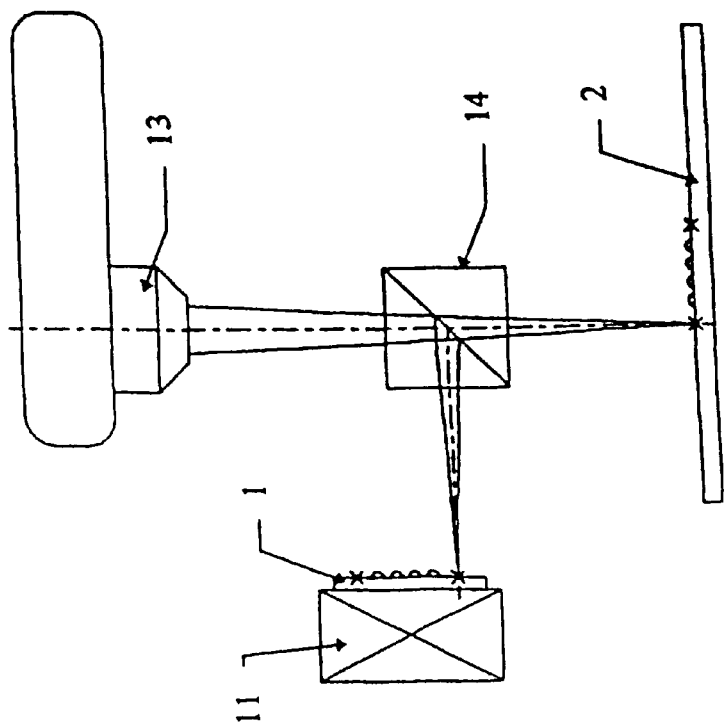
Figure 6B:
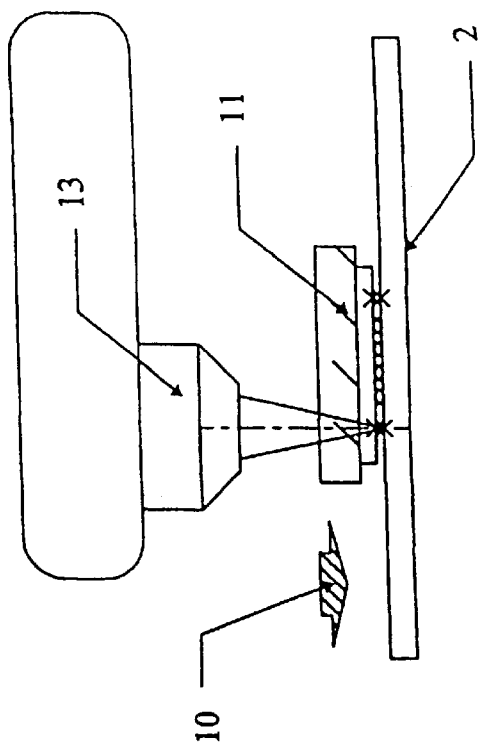
Figure 6A:
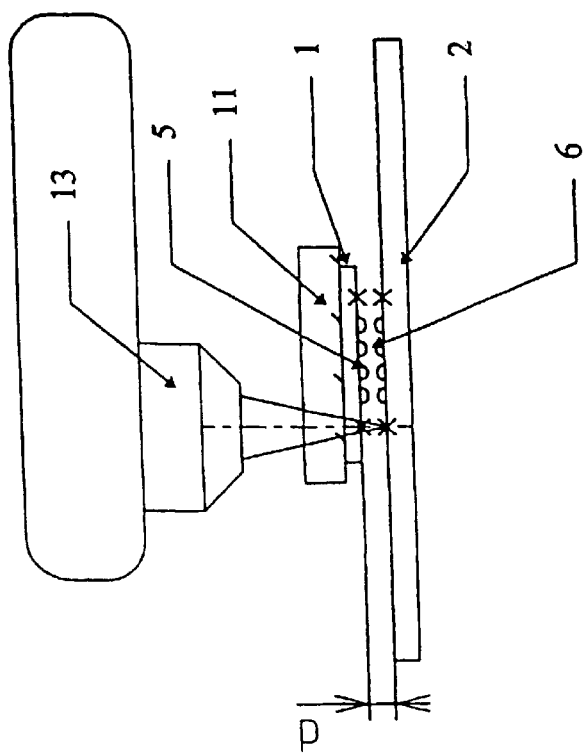
Figures 7, 8:
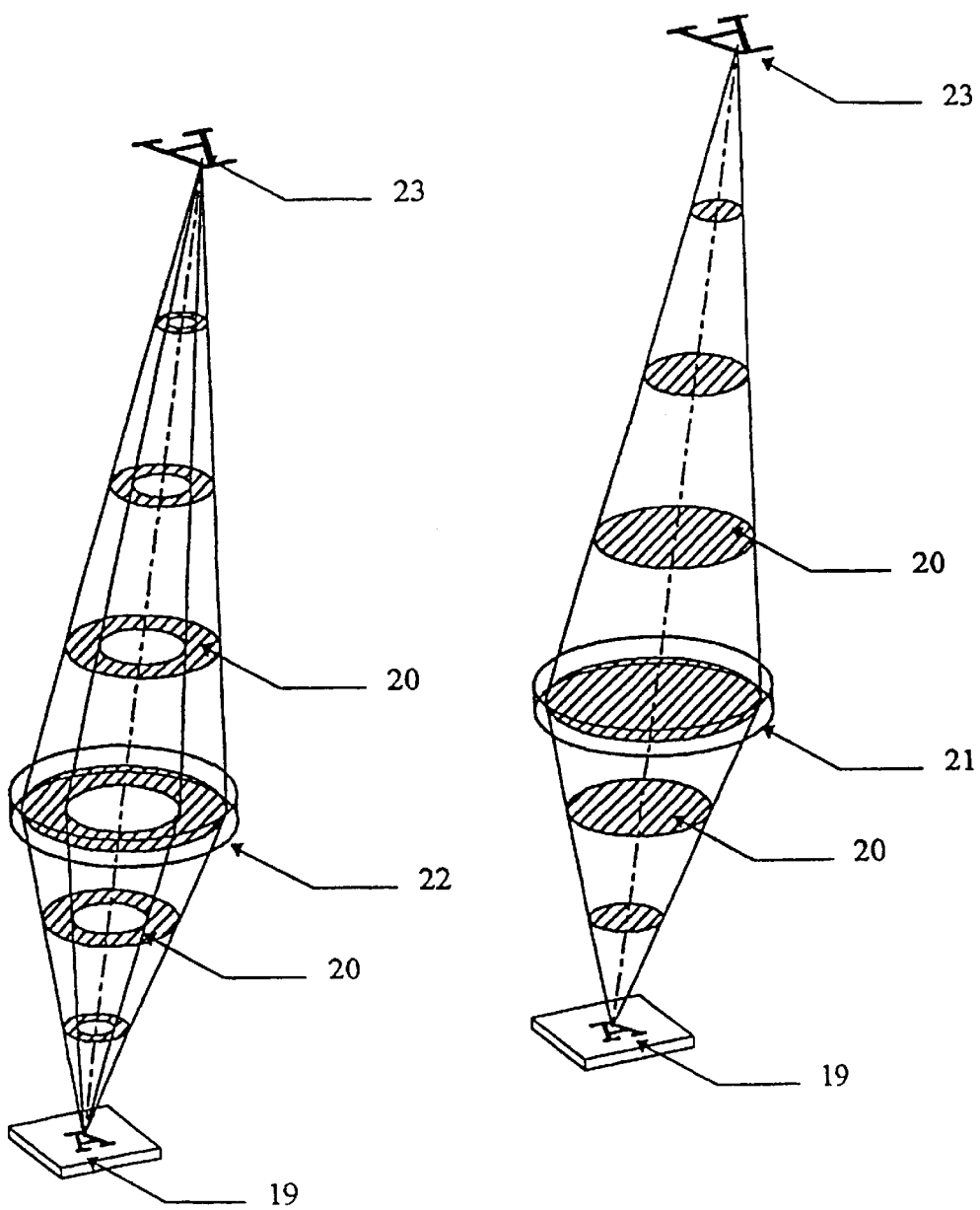
FIG. 7 shows a diagram of an optical system with central shutter.
FIG. 8 shows a diagram of an optical system without central shutter.

FIG. 8 represents an optical system without a central shutter. The light beams emanating from points of the object 19 have solid sections 20. The optical system 21 forms an image 23 of said object in its image plane. FIG. 7 represents an optical system with a central shutter. The light beams which emanate from points of the object 19 have annular sections 20. The optical system 22 forms an image of said object in its image plane 23. With the center of the optical system 22 not occupied by any light beam,—the volume defined by the interior of the light cone can thus be occupied by various mechanical elements. This particularity can be employed profitably for accommodating the terminal portion of the device 11 for maintaining the component 1.

Figure 9:
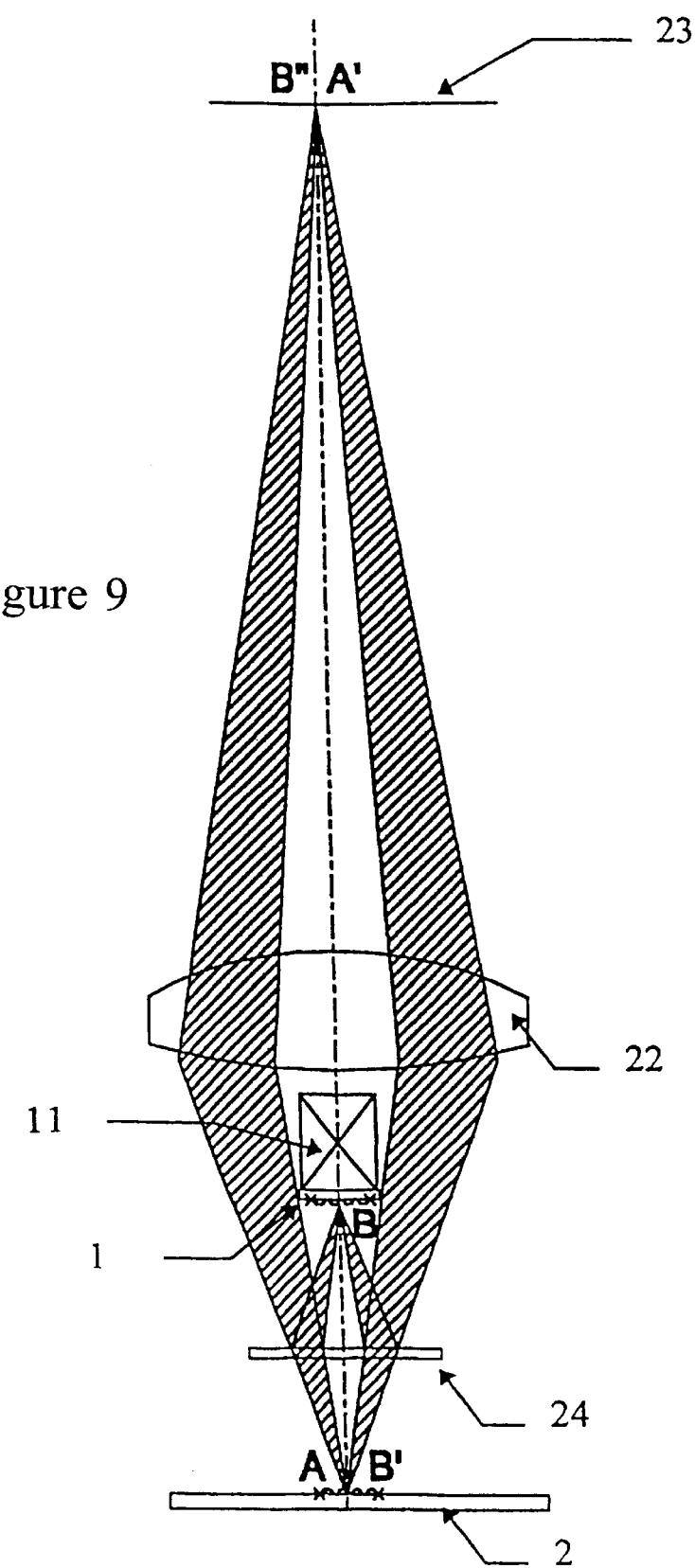
FIG. 9 illustrates the basic optical diagram of the invention.

FIG. 9 represents the optical diagram of the device according to the invention. A component 1 is maintained above a substrate 2 on which it must be positioned after having been aligned. On the maintenance device 11 of the component, the component can be retained by vacuum (maintained by suction), electrostatic forces, magnetic or other. A flat and parallel, semi-reflecting plate 24 is inserted between the component 1 and the substrate 2. The position of the plate 24 is adjusted in such manner that if one considers a point B of component 1, the plate 24 is going to create the virtual image B' of point B merged with a point A of the substrate 2. This adjustment is made either by displacement of plate 24 or by displacement of the mechanical device 11. One will notice in the image plane 23 of the optical system an actual image A' of the upper surface of the substrate 2 superposed with an actual image B" of the lower surface of the component 1. As a result, it is possible to visualize at the same time the alignment marks 3 of the component 1 and the alignment marks 4 of the substrate 2 and to correct by appropriate mechanical movements the position of the one relative to the other. At the end of said alignment phase, the plate 24 is retracted and the mechanical device 11 places the component 1 on the substrate 2. To the extent that the surface of the plate 24 is perfectly perpendicular to the placement trajectory 10 of the component 1 on the substrate 2, the differences in final position between the component 1 and the substrate 2 will be exactly those visualized by the optical system 22. By way of example, but not limited thereto, the visualization of images can take place with the aid of an ocular device, a photographic camera or a video camera.

Figure 10:
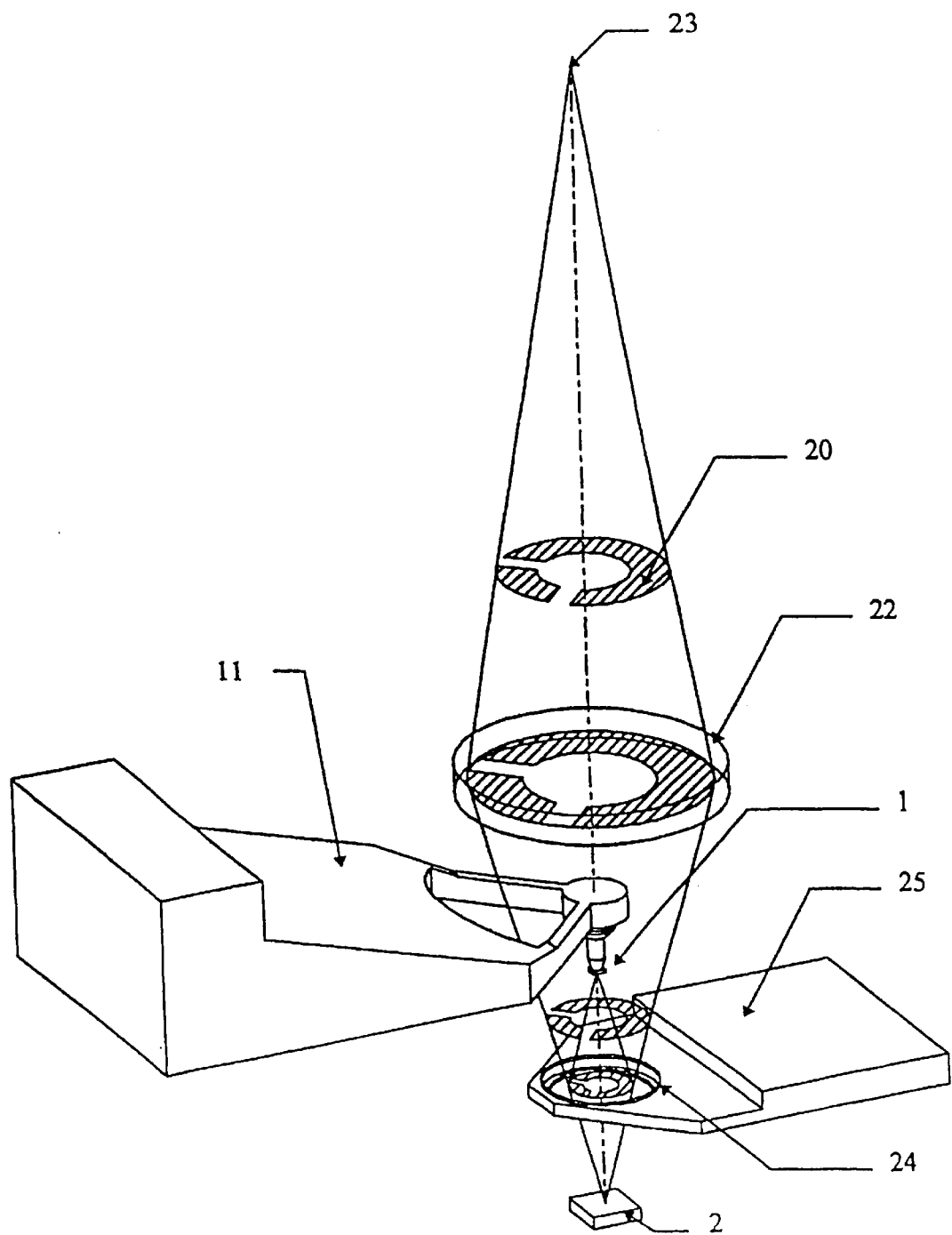
FIG. 10 illustrates the basic principle of the invention.

FIG. 10 represents one preferred schematic arrangement of the device according to the preferred embodiment. The central shutter of the optical system 22 is provoked by the extremity of the maintenance device 11 of the component 1. In this embodiment, the central shutter extends beyond the center of the optical system, along several zones. The sections 20 of the light beams then present themselves in form of circular sectors.

Figure 11:
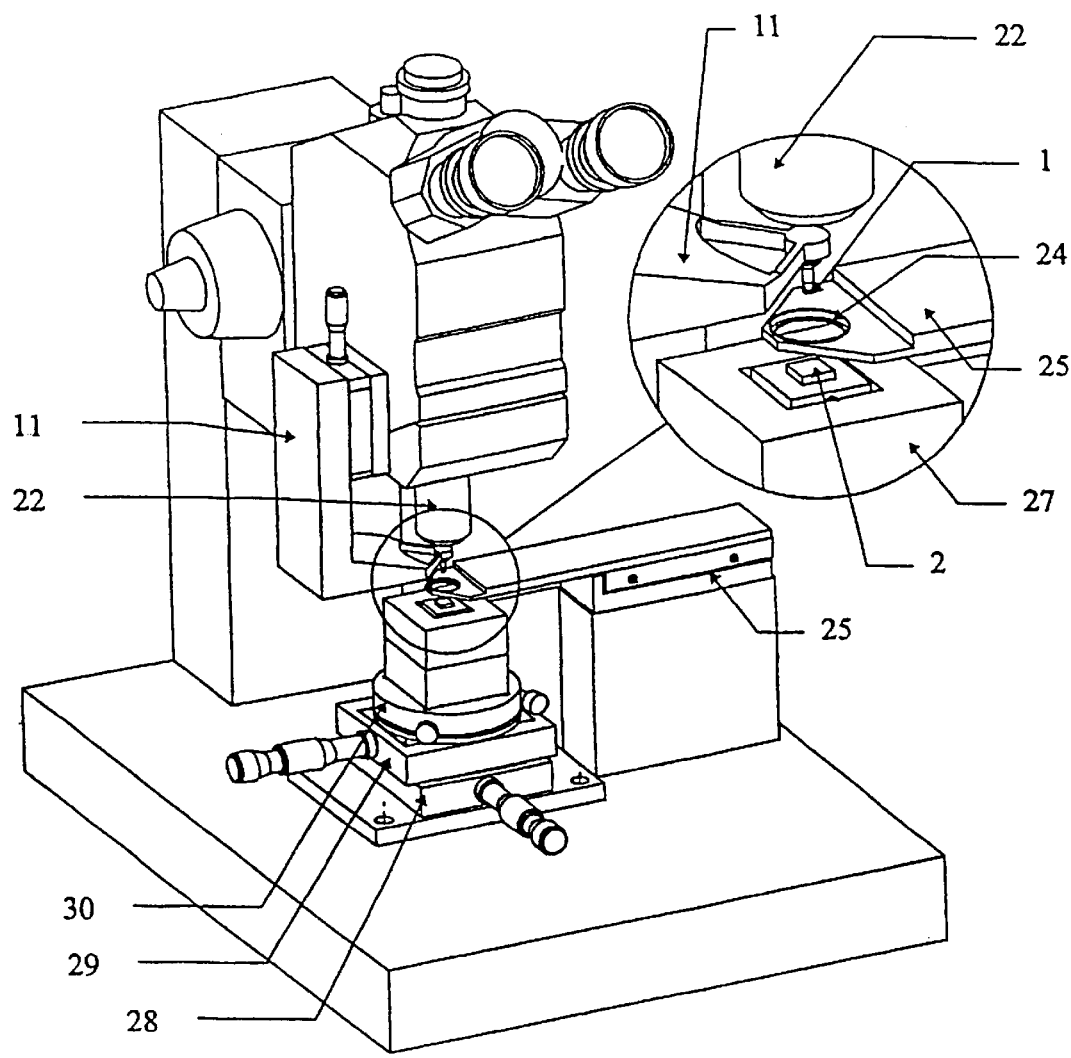
FIG. 11 and FIG. 12 illustrate an exemplary embodiment of the invention.
Figure 12:
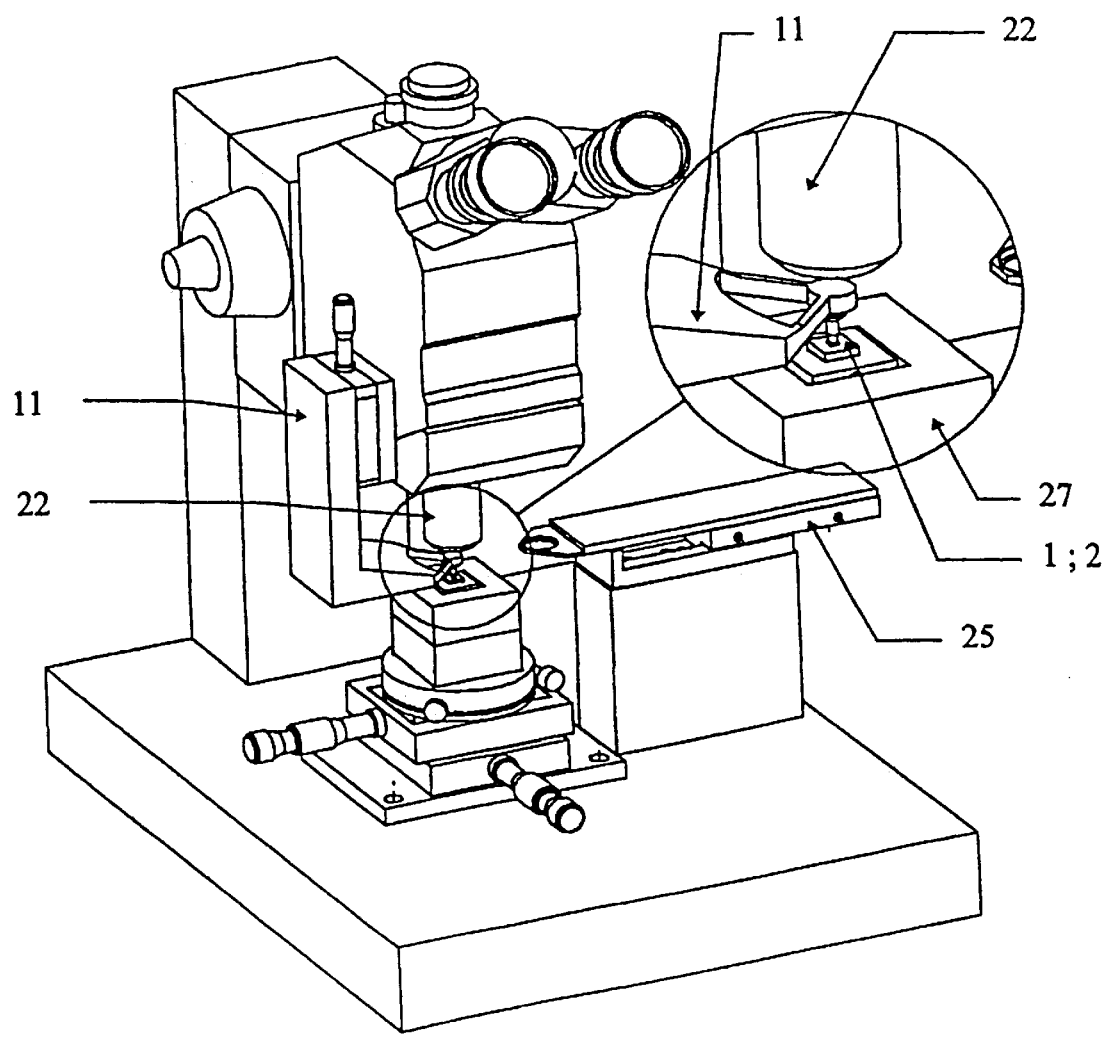

FIGS. 11 and 12 represent another, more detailed embodiment of the invention comprising a sighting device 22 (for example: measuring microscope), a maintenance device 11 of the component 1 which is adjustable through the intermediary of a micro-metric displacement table 26, a semi-reflecting plate 24 and its retracting device 25, a substrate 2 and a substrate alignment device 27. In case of the exemplary embodiment, but not limited thereto, the alignment device of the substrate is constituted by two tables with crossing linear, micro-metric displacements 28, 29 and one micrometric table with angular displacement around a vertical axis 30. FIG. 11 represents the device at time of alignment phase, FIG. 12 represents the device at time of the component placement phase. The retracting device 25 of the semi-reflecting plate 24 is withdrawn and the component 1 is placed on the substrate 2.

Industrial Applications

The invention is able to be utilized for any application requiring precision assembly of devices comprising small components (size on the order of 0.2 mm to 5 mm) for which high precision of placement is required, (on the order from 0. μm to several μm). Provided, herewith, is a listing of some application examples. However, application possibilities are not limited to these examples:

Assembly of micro-electronic components
Assembly of laser diodes on silicon micro banks
Assembly of optical fibers on silicon micro banks
Assembly of mechanical micro-components
Assembly of mechanical opto electro micro modules
Assembly of mechanical micro electro modules
Assembly and realization of micro-biological modules
Precision placement of non-solid materials, for examples droplets of glue or chemical products or biological cultures.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An aligning device for electronic, mechanical, optical, biological and hybrid micro-systems comprising:
    a sighting system;
    a transparent flat parallel plate, one of its surfaces being semi-reflective;
    a mechanical device for positioning a component, the component having upper and lower surfaces; and,
    the plate having a normal that merges with an optical axis of the sighting system forming on an upper surface of a substrate a virtual image of the lower surface of the component.

2. The device according to claim 1, further including:
    a central shutter of the sighting system at least partially forming a portion of the mechanical device.

3. The device according to claim 2, wherein the central shutter of the sighting system includes kata-dioptric lenses.

4. The device according to claim 2, wherein the shutter of the sighting system extends beyond the center of the sighting system.

5. The device according to claim 1, further including:
    a di-chroic coating on the reflective surface of the semi-reflecting plate that transmits a portion of the luminous spectrum utilized by the sighting system for the formation of a first image of the substrate upper surface, reflecting another portion of the luminous spectrum utilized by the sighting system for the formation of a second image of the component lower surface.

6. The device according to claim 1, further including:
    a hole in a center of the semi-reflective plate that permits the mechanical device to pass across the semi-reflective plate without withdrawing the semi-reflective plate.

7. The device according to claim 1, wherein the mechanical device includes at least a portion of the sighting system.

8. The device according to claim 1, wherein the mechanical device is provided with all the required freedom for positioning the component in space.

9. The device according to claim 1, wherein the substrate is moved to align the component with the substrate.

10. The device according to claim 1, further including:
    a micro-dispensing device for dispensing non-solid matter on the substrate.

11. A system for aligning a microcomponent with a substrate, the system comprising:
    a substrate having a pre-defined microcomponent receiving region;
    a mechanical system which positions a microcomponent spaced from and aligned with the microcomponent receiving region, the microcomponent having a substrate mating surface disposed facing the substrate receiving region;
    a lens which passes light travelling along hollow cones from the microcomponent receiving region of the substrate to the lens and from the lens to an image plane, the microcomponent being positioned within a hollow interior of the hollow cones, such that an image of the microcomponent receiving region of the substrate is focused around the microcomponent onto the image plane;
    a semi-reflective transparent plate disposed between the microcomponent and the substrate with a reflective surface facing the microcomponent such that (1) the image of the substrate microcomponent receiving region passes therethrough to be focused on the image plane and (2) an image for the microcomponent substrate mating surface is reflected to travel along the hollow cones to be focused on the image plane superimposed on the image of the microcomponent receiving region.

12. The system according to claim 11 further including:
    a drive system for moving one of the substrate and the mechanical system in three dimensions to adjust alignment of the microcomponent receiving region and the substrate mating surface.

13. The system according to claim 11 wherein the microcomponent includes at least one of an electrical micro device, a mechanical micro device, an optical micro device, a biological micro system, a hybrid micro system, chemical products, pharmaceutical products, radio-active compositions, biological products, and DNA fragments.

14. A method for aligning a substrate contacting surface of a microcomponent with a predefined microcomponent receiving region of a substrate, the method comprising:
    positioning a microcomponent with the substrate contacting surface spaced from and generally aligned with the substrate microcomponent receiving region;
    passing a light image of the substrate microcomponent receiving region around the microcomponent and focusing the image of the microcomponent receiving region on an image plane;
    reflecting and passing an image of the microcomponent substrate contacting surface around the microcomponent and focusing the image of the microcomponent substrate contacting surface on the image plane superimposed on the image of the substrate microcomponent receiving region;
    adjusting a position of the microcomponent to align the images of the substrate contacting surface and the microcomponent receiving region more precisely.

* * * * *